United States Patent [19]

Nelson

[11] 4,292,516
[45] Sep. 29, 1981

[54] PHOTO-OPTICAL KEYBOARD HAVING DEBRIS PROTECTION

[75] Inventor: Edward I. Nelson, Sunrise, Fla.

[73] Assignee: Burroughs Corporation, Detroit, Mich.

[21] Appl. No.: 75,394

[22] Filed: Sep. 14, 1979

[51] Int. Cl.³ .............................................. G01D 5/34
[52] U.S. Cl. ................................. 250/229; 340/365 P
[58] Field of Search ................................ 250/221, 229; 235/145 R; 178/17 C, 17 D; 340/365 P, 365 R, 365 L, 365 C; 400/479, 491.3

[56] References Cited

U.S. PATENT DOCUMENTS 3,761,919 9/1973 Baumann ...................... 340/365 P
3,787,837 1/1974 Allen et al. .................... 340/365 P Primary Examiner—David C. Nelms
Attorney, Agent, or Firm—David G. Rasmussen; Kevin R. Peterson; Edmund M. Chung

[57] ABSTRACT

The invention relates to a photo-optical keyboard having an improved keyboard housing and keys for the purpose of confining debris and liquid spills on the keyboard. The keyboard housing has a matrix of rows and columns of apertures for keys. The housing has recesses open to the top of the keyboard between the apertures. Further, there are structural supports between the apertures which separate the recesses and cause the recesses to be reservoirs. Multiple keys are positioned in the keyboard housing apertures. Each of the keys has an umbrella cap with edges extending over the recesses. Liquid or debris spilled on the umbrella cap will fall into the recesses to be contained.

6 Claims, 10 Drawing Figures

PHOTO-OPTICAL KEYBOARD HAVING DEBRIS PROTECTION

BACKGROUND OF THE INVENTION

1. Field of the Invention

The invention relates to photo-optical keyboards. More specifically, the invention relates to an improved keyboard housing and keys for protecting against liquid and debris spills.

2. Description of the Prior Art

Liquid spillage and debris falling into a keyboard are a serious problem. Liquid will normally drain down around the keystems and into the keyboard structure itself. This may be damaging to photo-optical keyboards since the liquid may get into the optical channels and present a blockage of light. Up to the present time there has been no satisfactory means of protecting against such spills and debris. Most keyboard manufacturers use some sort of optional plastic rainshield apron or boot that fits under the keycaps and serves to keep liquids out of the workings of the keyboard.

The present invention uses an umbrella shaped keyhead which overlaps recesses in the keyboard to catch spills and debris. The prior art shows umbrella shaped keyheads, for example in U.S. Pat. Nos. 3,787,837, 3,818,485, and 3,964,593. However, these references do not address the problem of spills or debris and do not disclose any means of catching a spill on a keyboard.

SUMMARY OF THE INVENTION

The present invention provides a keyboard assembly that allows liquid and debris spills on the keyboard to be contained in reservoirs. The invention is a combination of an umbrella shaped keytop which overlaps recesses in the keyboard housing. Spills drain off the keytop into the recesses. The keyboard housing has a matrix of rows and columns of apertures for keys. The housing has recesses open to the top of the keyboard between the apertures. The keyboard housing further has structural supports which separate the recesses into individual reservoirs. The reservoirs are of a size to be able to contain a substantial amount of liquid, and when full, overflow into adjacent reservoirs. The key openings are protected by higher walls.

Multiple keys are positioned in the keyboard housing apertures. Each of the keys has an umbrella cap with edges extending over the recesses between the apertures. As a result, liquid and debris spilling on the umbrella cap will fall into the recesses to be contained.

The novel feature of the invention is the use of keys with umbrella shaped heads in combination with a keyboard having recesses between the rows and columns of apertures. The umbrella cap has its edges extending over the recesses.

The subject matter of this application is related to the subject matter of co-pending U.S. patent applications entitled "Molded Plastic Photo-Optical Keyboard" by Edward Nelson, and "Photo-Optical Keyboard Having N Key Rollover" by Edward Nelson, John Lane, and Harry Mueller, filed concurrently with the present application and each with the same assignee as the present invention.

DETAILED DESCRIPTION OF THE PREFERRED EMBODIMENTS

Figure 1:
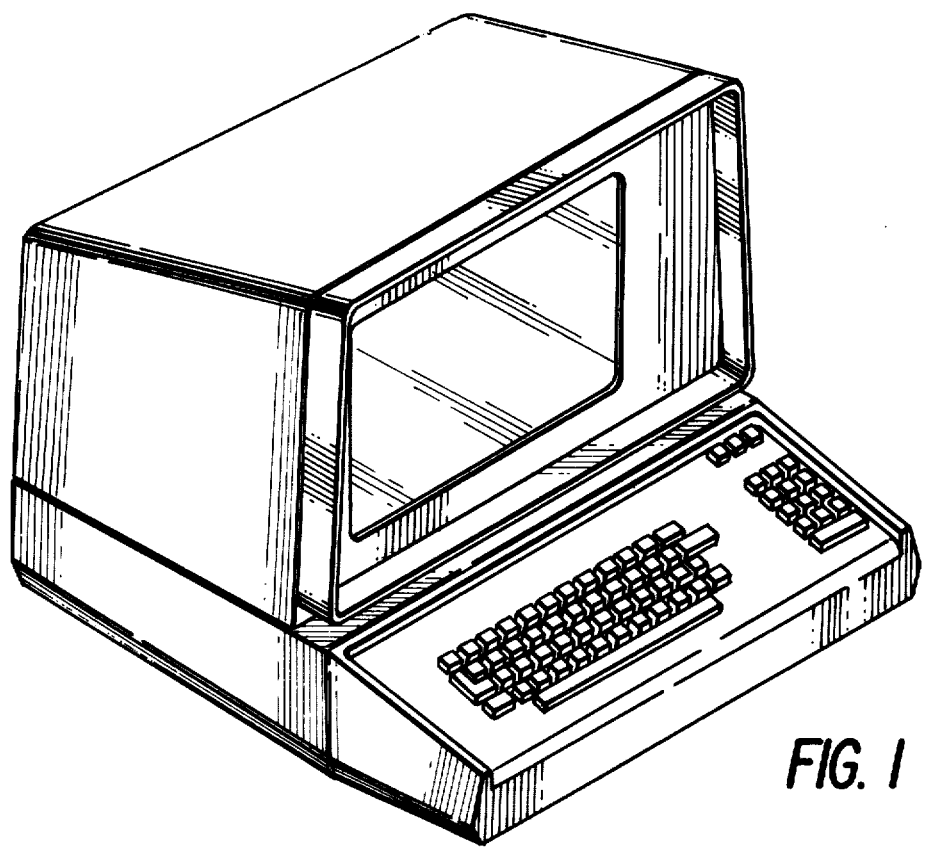
FIG. 1 is a perspective view of a CRT display terminal having a photo-optical keyboard.

FIG. 1 shows a typical operator terminal for a computer, word processor, or like type of system. The terminal may, for example, have the characteristics of a typewriter and a calculator. The keys may be in a rectangular matrix as calculator keys or in a staggered (offset) matrix as typewriter keys. All of the keys are located on one keyboard which has an excess capacity of key locations and is easily expandable to add other keys to the keyboard. The only change that needs to be made is the insertion of the key and the changing of the faceplate.

Figure 2:
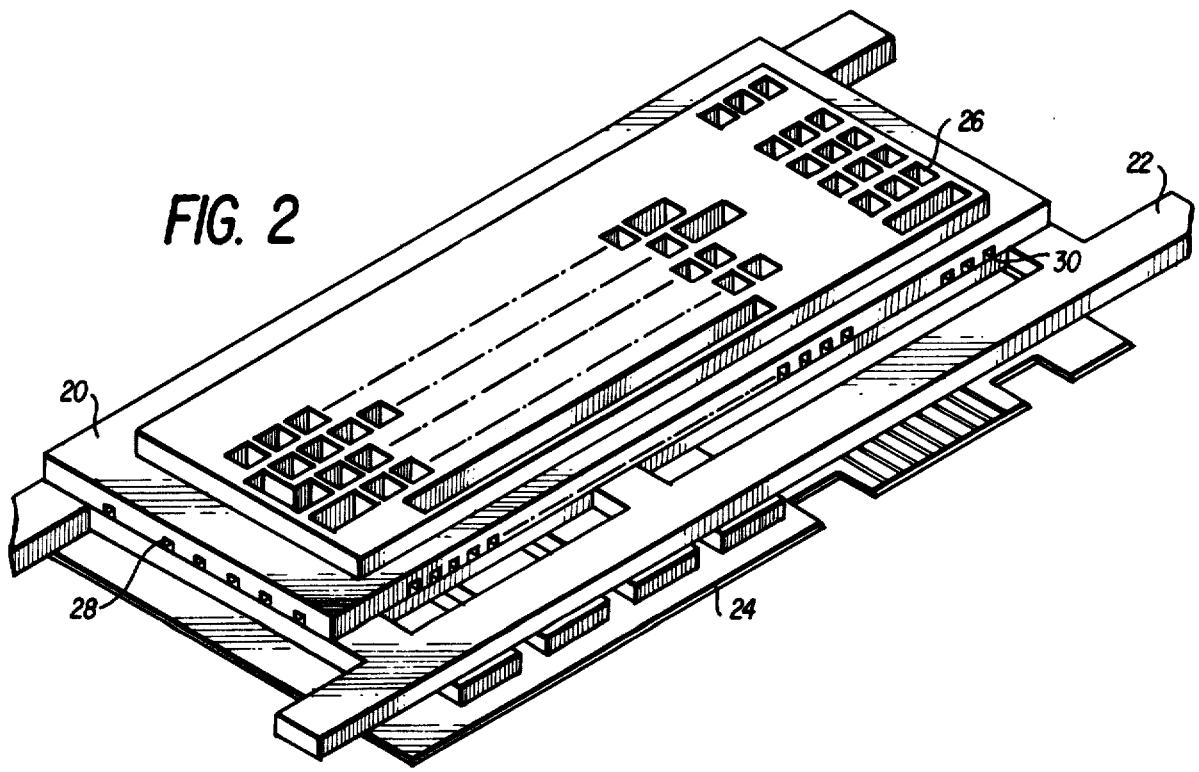
FIG. 2 is a perspective view of the photo-optical keyboard assembly having keys, faceplate, and CRT removed.

FIG. 2 shows the keyboard of FIG. 1 with the faceplate and keys removed. The keyboard consists of a keyboard housing 20, a baseplate 22, and a printed circuit board 24. The printed circuit board 24 is fastened to the underside of baseplate 22 by appropriate fasteners which are not shown.

Keyboard housing 20 has rectangular apertures 26 into which keys will fit. Only a few apertures are shown for illustration purposes. However, the whole raised portion of keyboard housing 20 normally has apertures. At the base of the keyboard housing are shown optical passages or light channels. Light channels 28 extend along one axis and light channels 30 extend along the other axis. Light channels 28 and 30 are entirely in keyboard housing 20. Light channels 28 extend between all of the apertures in each row. Light channels 30 extend between all of the apertures in each column. An illumination source such as a light, light emitting diode, or fiber optic bundle is placed at one end of light channels 28 and 30 and photoreceptors are placed at the other end. These are not shown.

Printed circuit board 24 contains all of the decoding and electronic circuitry necessary for the keyboard. This all may be done with conventional circuitry.

Figure 3:
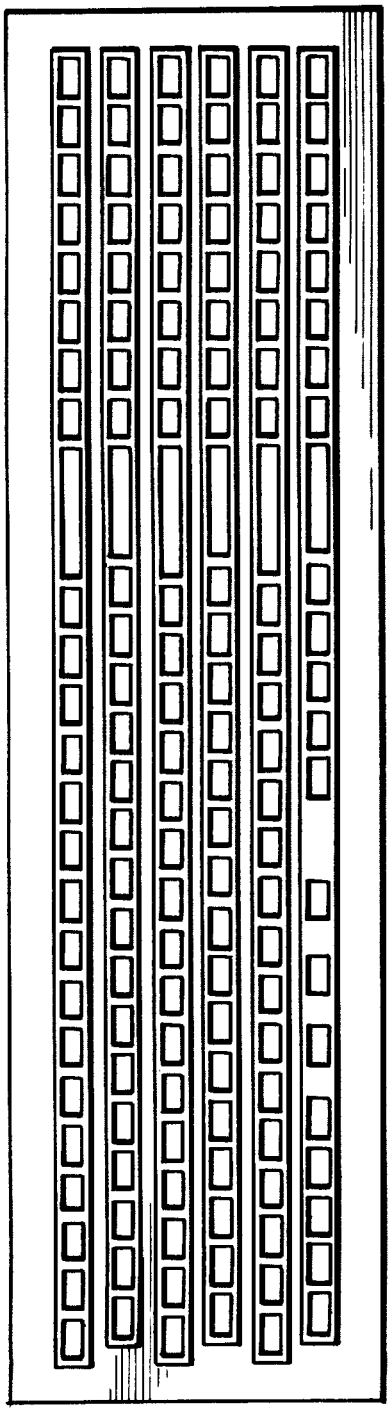
FIG. 3 is a plan view of a keyboard housing having key apertures in a rectangular matrix and a diagonal matrix.

FIG. 3 shows a more detailed top view of the key arrangement of the keyboard housing 20 of FIG. 2. The leftmost group of keys are in a staggered or offset matrix typical of a typewriter keyboard. The group of keys on the right are in a rectangular matrix typical of a calculator keyboard.

Figure 4:
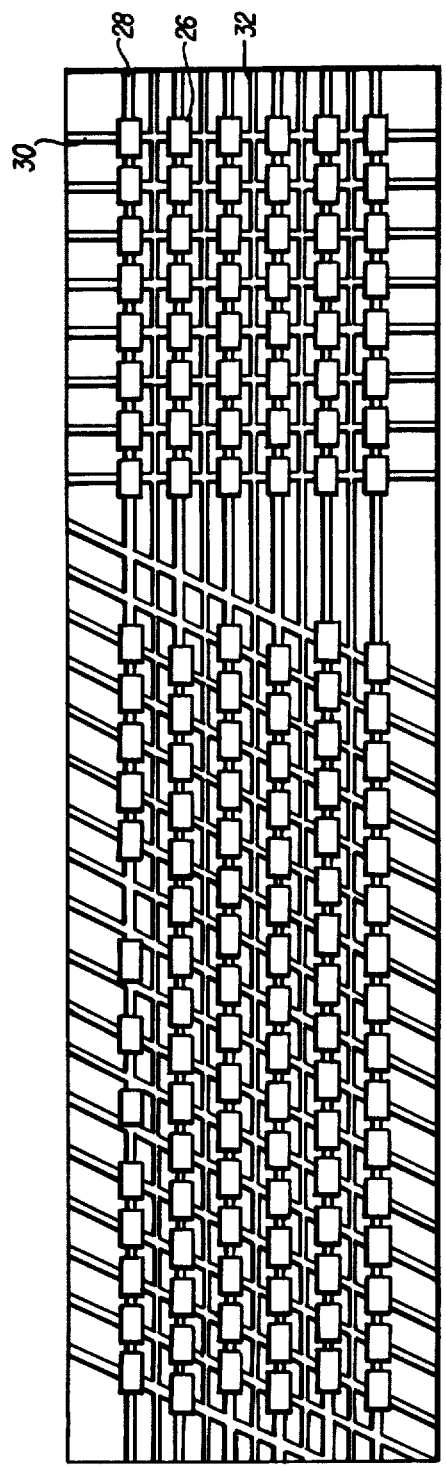
FIG. 4 is a bottom view of the keyboard housing of FIG. 3 showing light channels for both the diagonal matrix and the rectangular matrix.

FIG. 4 is a bottom view of the keyboard housing of FIG. 2. The bottoms of apertures 26 in both the offset matrix and the square matrix have light channels 28 and 30 passing through the rows and columns respectively. Between each of the rows are light isolation barrier channels 32 which are molded into the bottom of keyboard housing 20.

Figure 5:
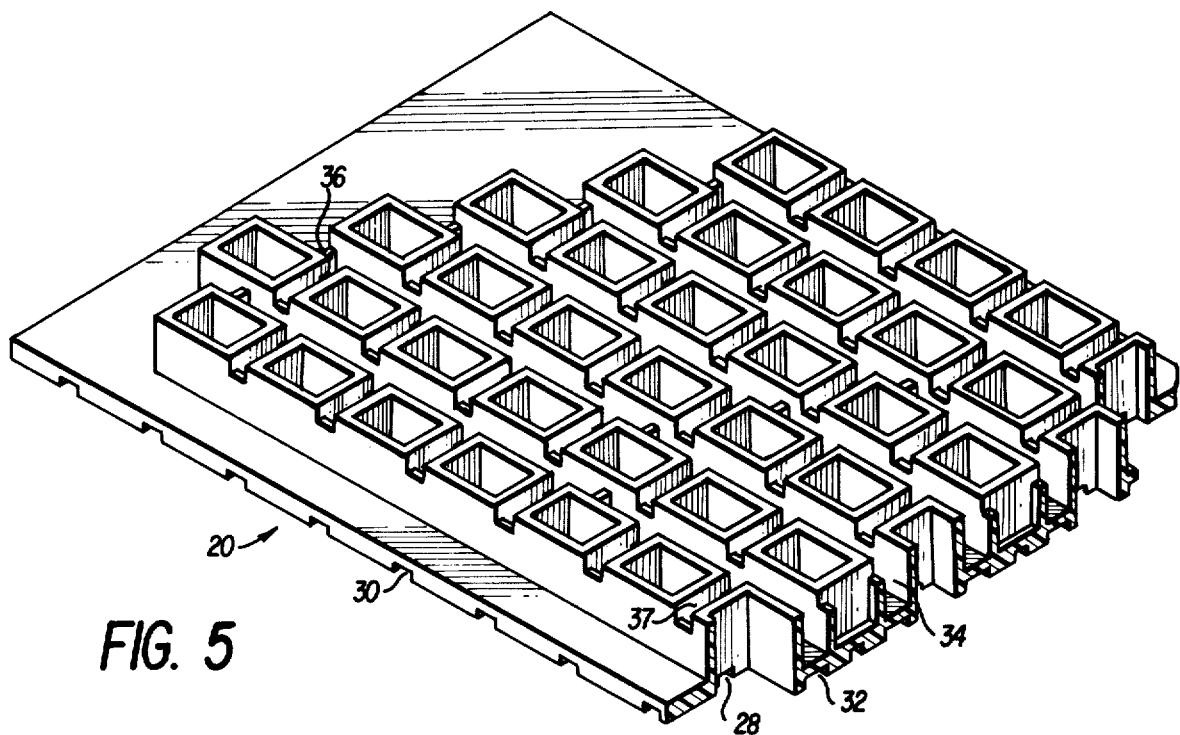
FIG. 5 is a perspective partial sectional view of the diagonal matrix portion of the keyboard housing of FIG. 3.

FIG. 5 shows a partial sectional view of keyboard housing 20. Light channels 28 and 30 are shown at the bottom of the keyboard housing. These channels are of the order of 3/32 inch in depth.

Between rows of apertures 26 are recesses 34 and structural members 36. The structural members are below the top surface of the keyboard housing. Between columns of apertures 26 are recesses 37.

Figure 6:
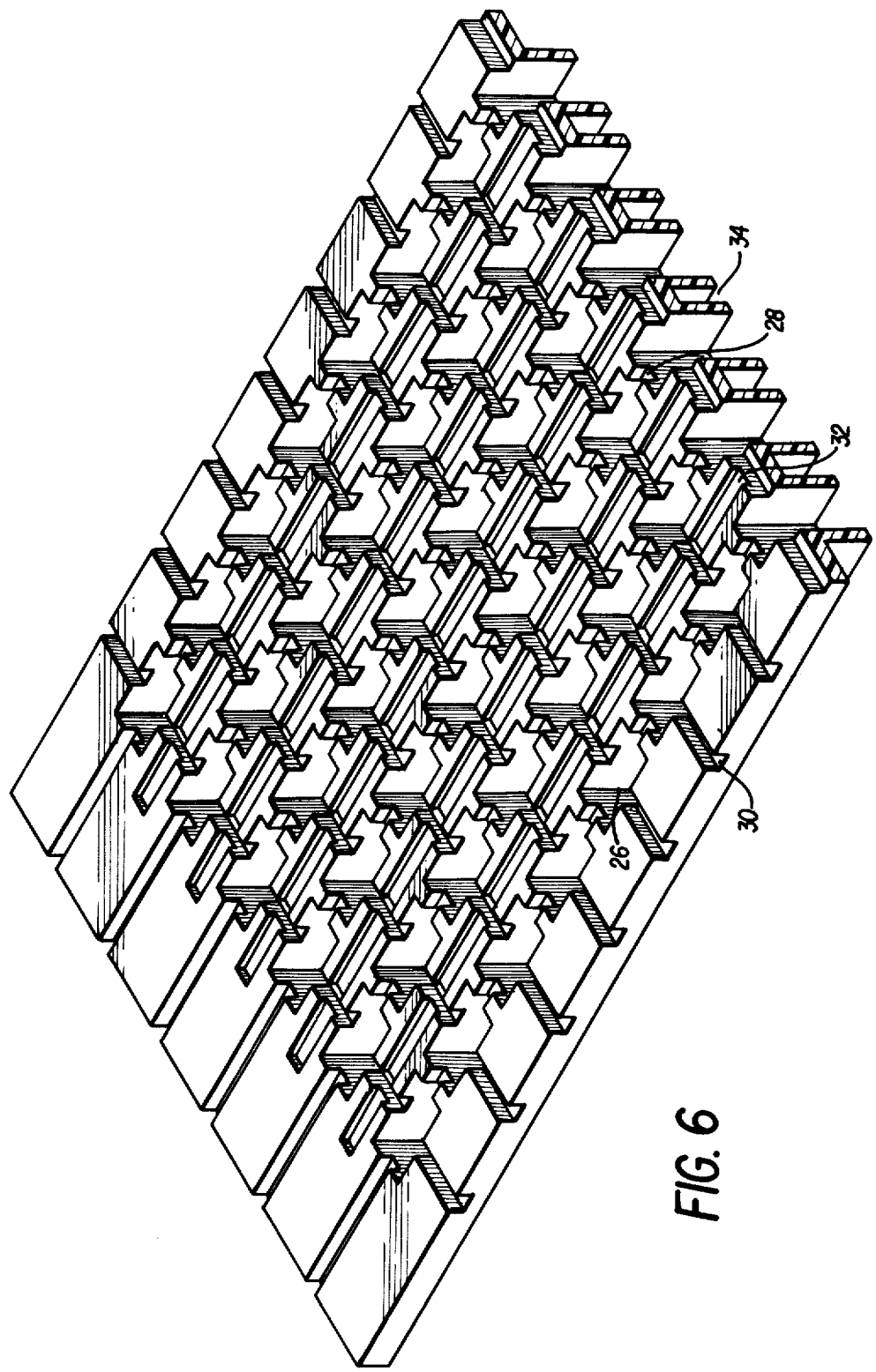
FIG. 6 is a perspective partial sectional view of the bottom of the rectangular matrix portion of the keyboard housing of FIG. 4.

FIG. 6 shows a sectional view of the bottom of a keyboard housing. Light channels 28, 30 passing through apertures 26 are open to the bottom of the keyboard housing. Light isolation channels 32 are also open to the bottom of the keyboard housing. Recesses 34 are also shown.

The light channels, light isolation barrier channels, and aperture orientation allow the keyboard housing to be molded from plastic in one molding operation.

Figure 7:
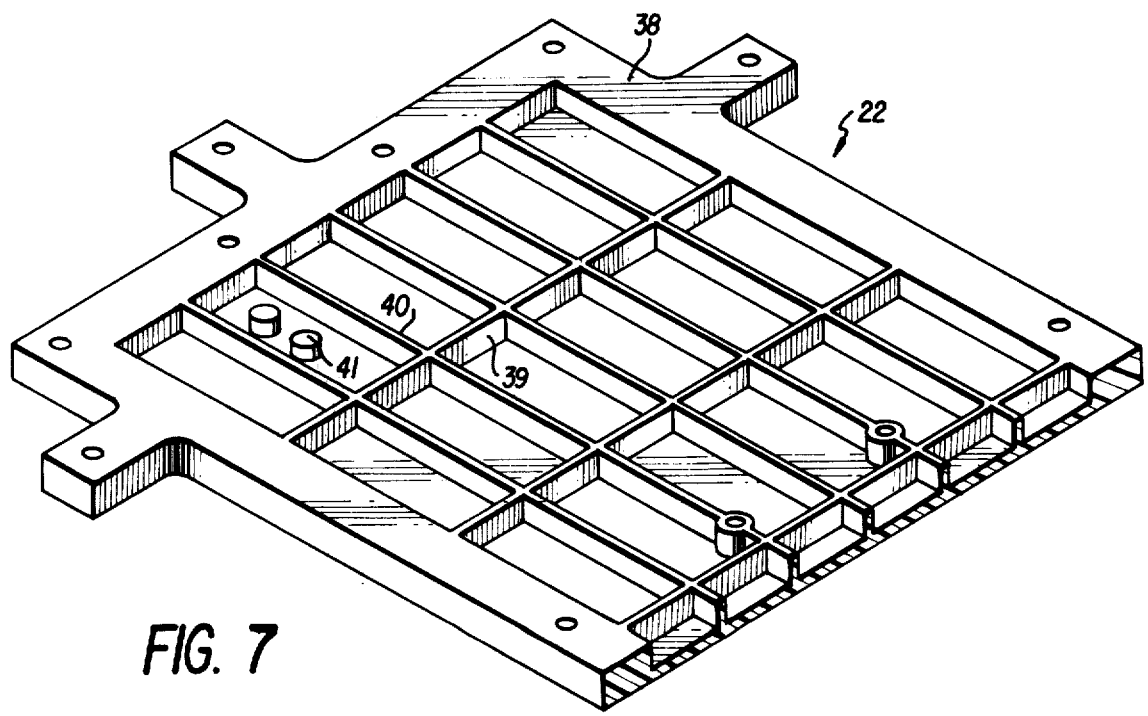
FIG. 7 is a perspective partial sectional view of the baseplate of the keyboard assembly of FIG. 2.

FIG. 7 shows base plate 22 of the keyboard. The outer edge 38 will fit flush to the bottom of keyboard housing 20. The inner portion of base plate 22 is recessed with light isolation barriers 40 (i.e. ribs) running in the direction of the rows. Structural supports 39 run in the direction of the columns. The light isolation barriers 40 are intended to fit up into light isolation channels 32 (shown in FIG. 6). The light isolation barriers are required to prevent divergent light from one row from impinging on a photoreceptor for another row. The rows are long, of the order of 20 inches, and light divergence is large, therefore, the light isolation barriers are needed. On the other hand, the columns are short, of the order of 4 inches, and divergence is smaller so the barriers are not needed. The ribs have been added between every two or three columns only for strength. Projections 41 are spring retainers which are placed at a location below each aperture 26 of the keyboard (only two are shown). The structure of baseplate 22 may be molded from plastic in a one piece molding operation.

Figure 8:
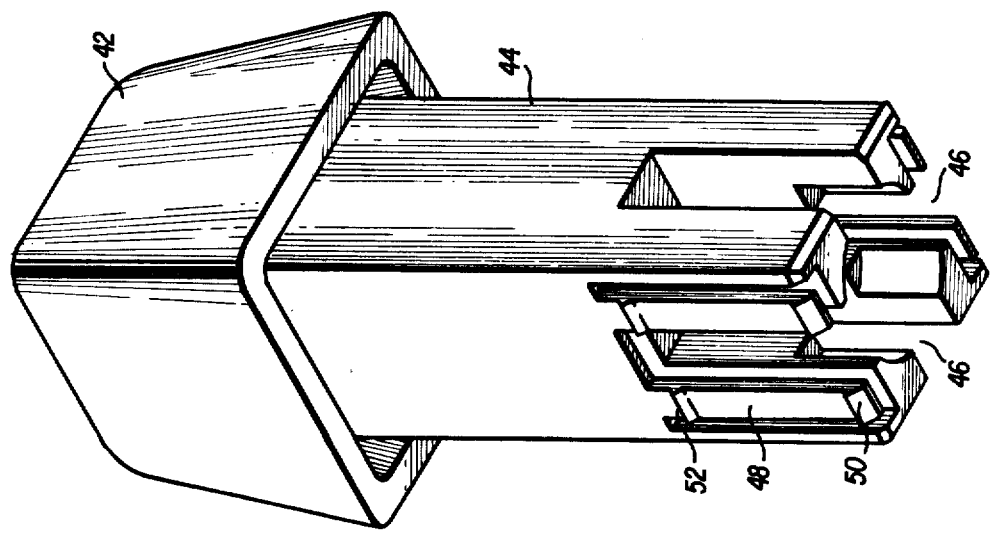
FIG. 8 is a perspective view of a key used in the keyboard assembly of FIG. 2.

FIG. 8 shows a key for use in keyboard housing 20. The key has an umbrella-shaped cap 42 and a large rectangular keystem 44. The key has slots 46 which open to the bottom of the key. The inner portion of the key is cut away to allow the key to fit over spring retainer 41 of baseplate 22. At two edges of the key are flexible fingers 48. At the bottom of each of the flexible fingers is a flange 50. Also on each flexible finger is a small ridge 52. The way light slots 46 are constructed, being open to the bottom of the key, makes the key well suited for being molded in one piece. The key is made of high wear plastic such as acetel. An example is Delrin manufactured under trademark by DuPont.

Figure 9:
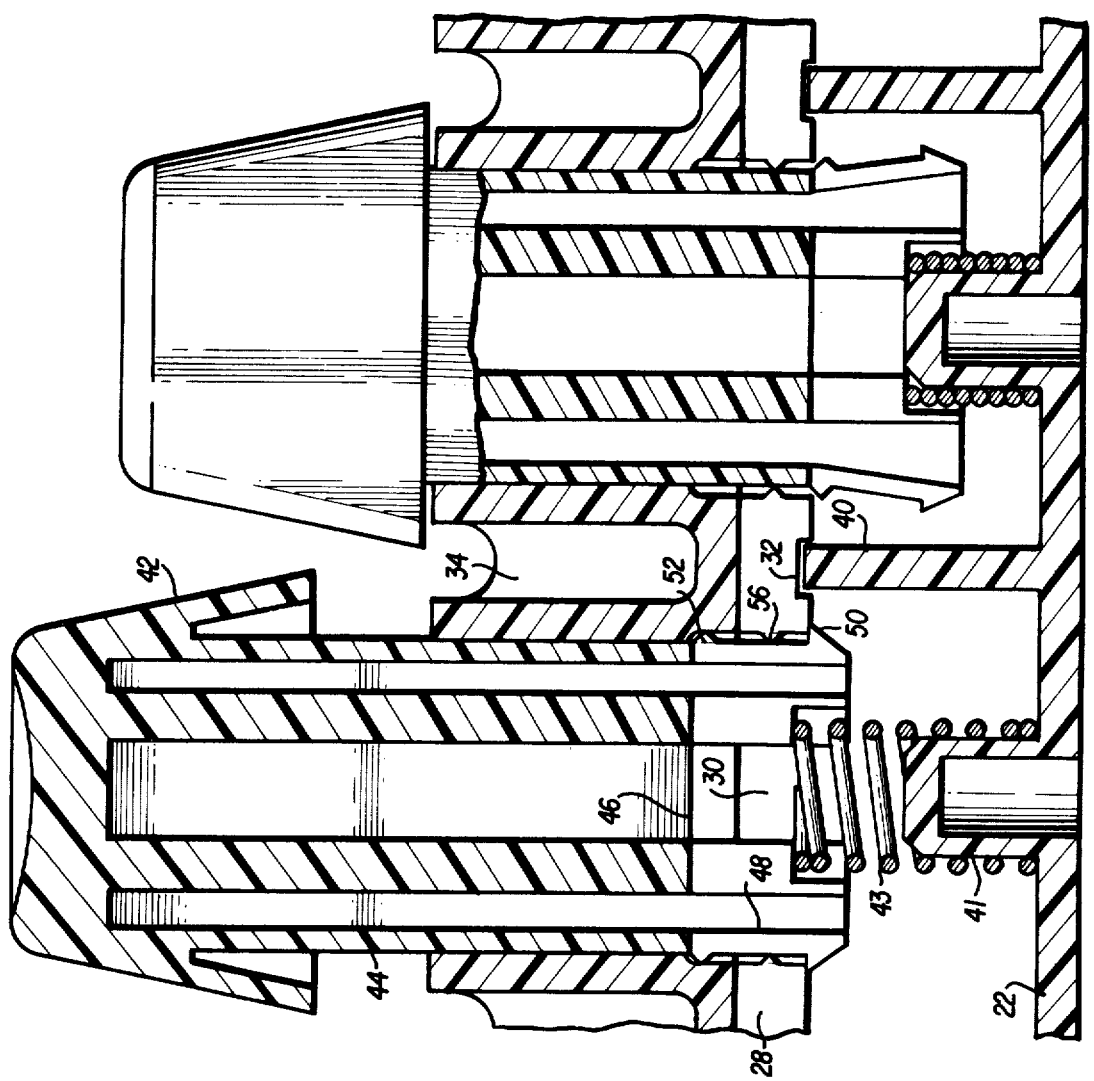
FIG. 9 is a sectional view of the keys shown in FIG. 8.

FIG. 9 shows a sectional view of the key of FIG. 8 inserted in the keyboard housing 20. The head of the key 42 extends over recess 34 (and recess 37 not shown). This allows any liquid spills on the keyboard to be trapped in recesses 34 and 37 rather than draining into the keyboard. Keystem 44 extends through aperture 26 of the keyboard housing 20. The interior surface of aperture 26 has ridges 56. These ridges are meant to contact ridges 52 on flexible fingers 48 of the key to provide a tactile feel to the key when it is depressed. The flexible fingers allow the ridges to pass after contact is made. The exact pressure needed for the tactile feel is preset and determined by the slope of ridges 52 and 56. At the end of flexible fingers 48 are flanges 50 which serve as stops to prevent the key from coming out of aperture 26. The flexibility of the fingers 48 allows the keys to be withdrawn easily for replacement. When the key is withdrawn the pressure will cause the fingers to flex inwardly and allow the key to come out. More force is needed to remove the key than is available in the spring, thus the key cannot otherwise come out.

Light channel 28 is shown extending from left to right across FIG. 9. Light channel 30 comes out of the drawing and is in the same plane as light channel 28. Slot 46 is molded so that a portion of the opening is above light channel 30. This allows for a small amount of free travel of the key, about 3/32 of an inch before a key depression is registered. The remaining 3/32 travel of the key is for actuation. An operator may keep his fingers on the keys with a slight pressure even when not intending to depress the key.

Spring retainer 41 is a raised projection from base 22. The spring retainer prevents slippage of spring 43. Umbrella cap 42 contacts keyboard housing 20 to prevent keystem 44 from being depressed all the way to the bottom of baseplate 22, (shown in the depressed key at right). Light isolation barriers 40 extend up into light isolation channels 32.

In operation the photo-optical keyboard generally operates the same as the prior art optical keyboards. The principles are the same and the circuitry and decoding logic may be of a conventional type. What differs about the present invention is the simplification of a keyboard to improve the operation to overcome the debris problems of the prior art.

The advance in the present keyboard is the combination of the keys having umbrella keyheads and the keyboard housing having recesses between the rows and columns of apertures. The keyboard housing further has structural supports between the rows which serve as separators in the recesses and create individual reservoirs. This combination provides an inexpensive simple means for catching liquid and debris spills which may fall on the keyboard.

Figure 10:
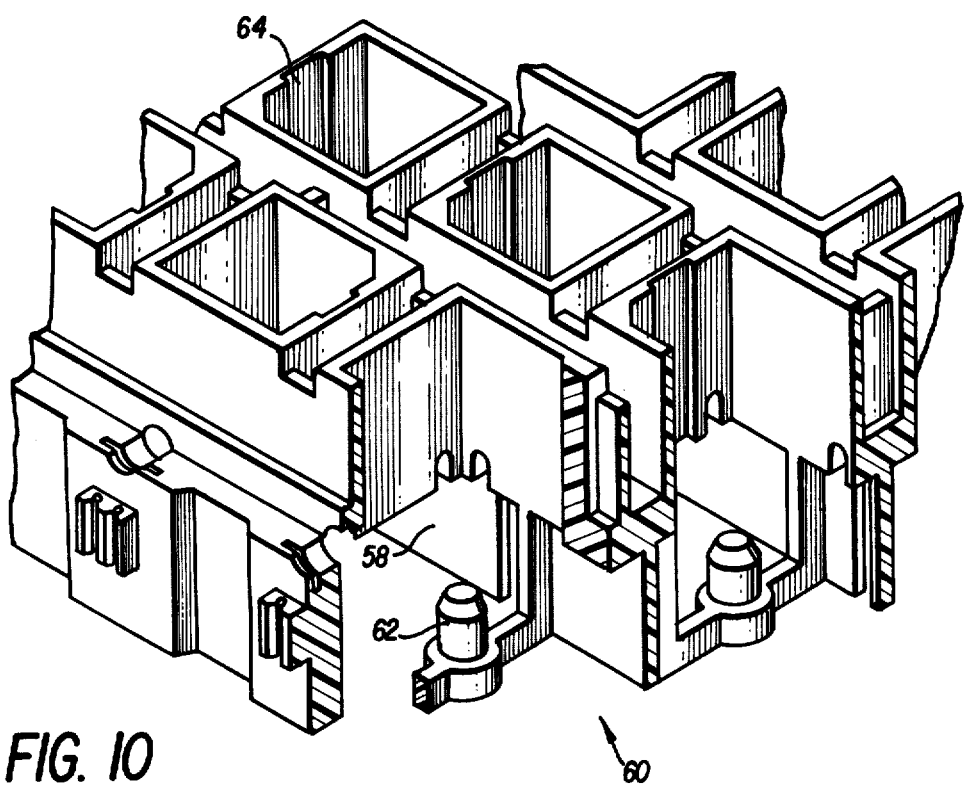
FIG. 10 is a perspective partial sectional view of an alternative keyboard housing.

An alternative embodiment to the apparatus shown in FIGS. 1-9 is shown in FIG. 10. This embodiment is simpler in structure and is preferred under some circumstances. In this embodiment light isolation barriers 58 extend downward from keyboard housing 60. This is in contrast to the previous embodiment where the light isolation barriers 42 extend up from the base plate (shown in FIG. 7). By molding the light isolation barriers 58 as part of the keyboard housing 60 the need for a base plate is eliminated. The spring retainers 41 of baseplate 22 (FIG. 7) are replaced by spring retainers 62 which are supported between the light isolation barriers 58.

What is claimed is:

1. A photo-optical keyboard comprising:
    a keyboard housing having a matrix of rows and columns of apertures for keys, said housing having recesses open to the top of the keyboard between said apertures; and
    multiple keys for positioning in said keyboard housing apertures, said keys each having an umbrella cap with edges extending over said recesses between said apertures, whereby liquid and debris spilling on said umbrella cap will fall into said recesses to be contained.

2. The apparatus of claim 1 comprising structural supports between said rows and columns of apertures, said structural supports separating said recesses into individual reservoirs.

3. The apparatus of claim 2 in which said recesses are between said rows of apertures.

4. The apparatus of claim 3 in which said recesses are between said columns of apertures.

5. The apparatus of claim 2 in which the tops of said structural supports are below the level of the top edges of said apertures for keys, thus allowing spills to flow from one recess to another and not flowing into a key aperture.

6. A photo-optical keyboard comprising:
 a keyboard housing having a matrix of rows and columns of apertures for keys, said housing having recesses open to the top of the keyboard between said apertures, the underside of said housing having one or more light channels for each row passing between the apertures for each row and one or more light channels for each column passing between the apertures for each column, each said light channel opening up at the underside surface of said housing;

light isolation barriers positioned beneath said keyboard housing between said rows and extending downward to prevent crossover of light between said rows; and multiple keys shaped to said apertures, said keys having passages to allow light from said light channels to pass in the undepressed position, said key causing an interruption of light in said light channels in the depressed position, said keys each having an umbrella cap with edges extending over said recesses between said apertures, whereby liquid and debris spilling on said umbrella caps will fall into said recesses to be contained.

* * * * *